United States Patent
Liu et al.

(10) Patent No.: US 9,922,837 B2
(45) Date of Patent: Mar. 20, 2018

(54) ASYMMETRIC APPLICATION OF PRESSURE TO A WAFER DURING A CMP PROCESS

(71) Applicant: Taiwan Semiconductor Manufacturing Co., Ltd., Hsin-Chu (TW)

(72) Inventors: Chih-Wen Liu, Taoyuan (TW); Che-Hao Tu, Hsinchu (TW); Po-Chin Nien, Taipei (TW); William Weilun Hong, Hsinchu (TW); Ying-Tsung Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/058,956

(22) Filed: Mar. 2, 2016

(65) Prior Publication Data

US 2017/0256414 A1 Sep. 7, 2017

(51) Int. Cl.
*H01L 21/302* (2006.01)
*H01L 21/306* (2006.01)
*H01L 21/66* (2006.01)
*H01L 23/544* (2006.01)
*H01L 21/67* (2006.01)
*H01L 21/321* (2006.01)

(52) U.S. Cl.
CPC .... *H01L 21/30625* (2013.01); *H01L 21/3212* (2013.01); *H01L 21/32115* (2013.01); *H01L 21/67092* (2013.01); *H01L 22/12* (2013.01); *H01L 22/26* (2013.01); *H01L 23/544* (2013.01); *H01L 2223/54493* (2013.01)

(58) Field of Classification Search
CPC ... B24B 37/34; B24B 37/00; H01L 21/31155; H01L 21/3212; H01L 21/30625; H01L 21/67092; H01L 2223/54493; H01L 23/544; H01J 37/3171
USPC .......... 438/691, 692, 693, 345.13; 451/398; 156/345.12, 345.13
See application file for complete search history.

(56) References Cited

U.S. PATENT DOCUMENTS

| | | | |
|---|---|---|---|
| 2002/0137448 A1* | 9/2002 | Suh | B24B 37/32 451/398 |
| 2005/0028931 A1* | 2/2005 | Fukaya | B24B 37/30 156/345.12 |
| 2007/0051619 A1* | 3/2007 | Mazur | B23H 5/08 204/250 |
| 2016/0074989 A1* | 3/2016 | Fukushima | H01L 21/31053 438/692 |
| 2016/0090660 A1* | 3/2016 | Mitra | C25D 5/22 205/136 |

* cited by examiner

*Primary Examiner* — Lan Vinh
(74) *Attorney, Agent, or Firm* — Haynes and Boone, LLP

(57) ABSTRACT

A method includes measuring a topography of a wafer, determining that a first portion of the wafer has a greater thickness than a specified thickness. The method further includes, after measuring the wafer, performing a Chemical Mechanical Polishing (CMP) process to a first side of the wafer, and during application of the CMP process, applying additional pressure to a region of the wafer, the region comprising an asymmetric part of the wafer, the region including at least a part of the first portion of the wafer.

17 Claims, 7 Drawing Sheets

US 9,922,837 B2

ASYMMETRIC APPLICATION OF PRESSURE TO A WAFER DURING A CMP PROCESS

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One process that is often used in the semiconductor fabrication industry is a Chemical Mechanical Polishing (CMP) process. A CMP process involves polishing the surface of the wafer on a polish pad while applying a slurry solution. The slurry solution typically includes chemicals to help break up the surface of the wafer. The slurry solution also typically includes abrasive particles suspended within the slurry solution to provide mechanical forces to help break up the surface of the wafer. The purpose of the CMP process is to make the surface of the wafer as flat as possible. Thus, it is desirable to find methods to improve the CMP process to provide a more planar surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
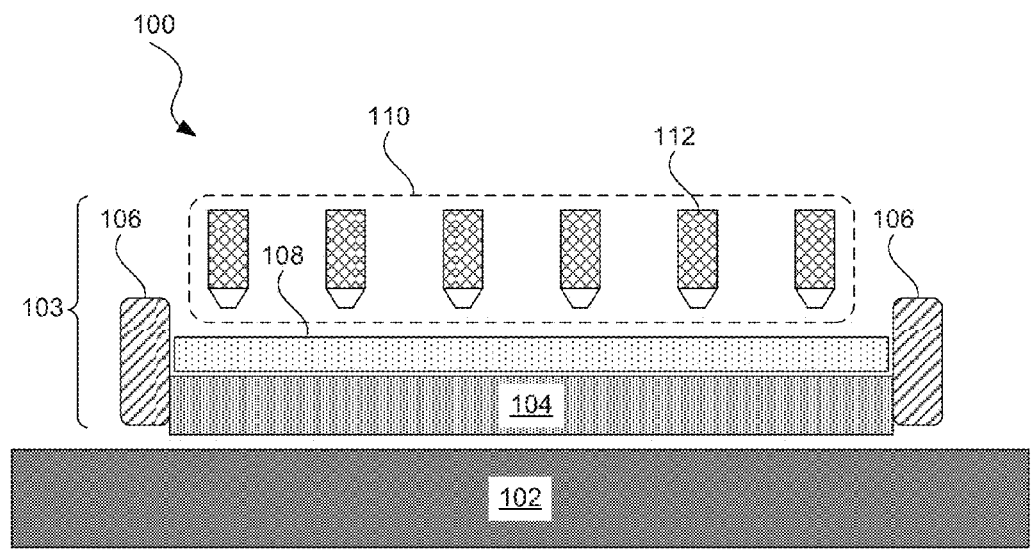
FIG. 1A is a diagram showing an illustrative side view of a wafer secured within a CMP tool configured to selectively apply additional pressure to different regions the wafer, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and, clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, the purpose of the CMP process is to make the surface of the wafer as flat as possible. Thus, it is desirable to find methods to improve the CMP process to provide a more planar surface. Some conventional CMP tools may vary the amount of pressure applied to a wafer by radial zones. Specifically, additional pressure applied at a specific radius is applied, to the entire wafer at that radius.

According to principles described herein, however, additional pressure may be applied in an asymmetric manner. In other words, various regions within the wafer that are not divided into radial zones may have additional pressure applied. For example, it may be determined that a specific portion of the wafer has a greater than average thickness that should be further reduced during the CMP process. This additional thickness can be eliminated by applying additional pressure at a specific region corresponding to the portion with a greater thickness. But, it is undesirable to apply additional pressure to regions that do not have the additional thickness. In one example, the CMP tool is able to apply additional pressure to specific regions divided according to an asymmetric grid. In some examples, the asymmetric grid may be a non-radial grid such as a rectangular grid.

FIG. 1A is a diagram showing an illustrative side view of a wafer 104 secured within a CMP tool 100 configured to selectively apply additional pressure to different regions the wafer 104. According to the present example, the CMP tool 100 includes a polishing pad 102 and a polish head 103. The polish head 103 includes a retaining ring 106 and a set 110 of gas heads 112.

The polishing pad 102 is generally a flat, round surface on which a wafer is pressed to perform a CMP process. The polishing pad 102 is generally larger than the surface of the wafer 104. In some examples, the polishing pad 102 is supported by a rotating platen. During the CMP process, the wafer 104 is pressed up against the polishing pad 102 as the polishing pad 102 rotates. Additionally, a CMP slurry is applied to the polishing pad 102 during the CMP process.

The polish head 103 is used to press a wafer 104 up against the polishing pad 102 during the CMP process. In the present example, the polishing head 103 includes a retaining ring 106 to hold the wafer 104 in place. Additionally, the polishing head 103 includes a set 110 of gas heads 112 that can selectively apply gas to different regions of the wafer 104 through a membrane 108. The membrane 108 is placed adjacent the wafer on a side opposite that of the side that is pressed up against the polishing pad 102.

Figure 1B:
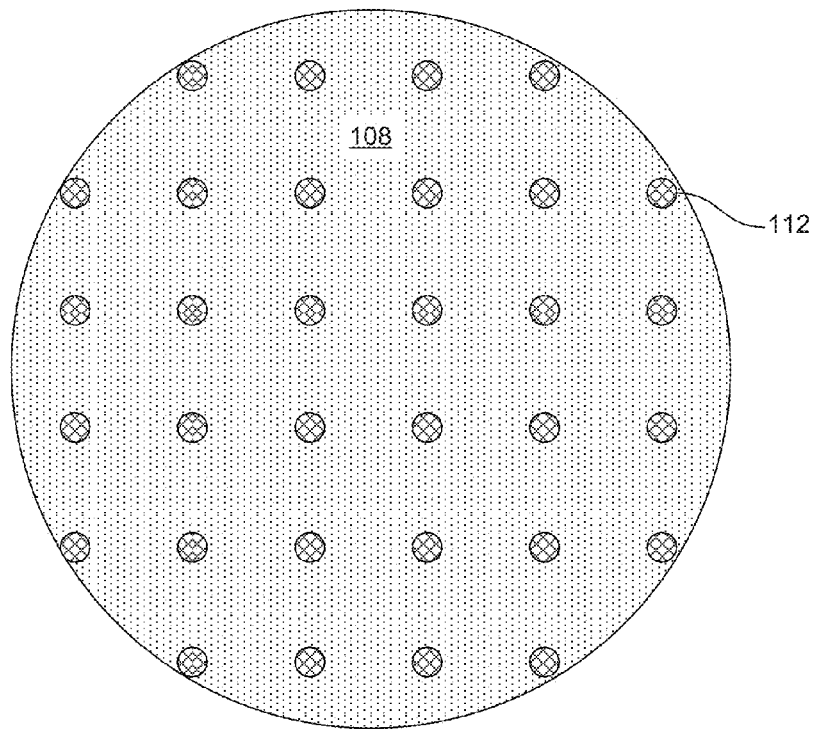
FIG. 1B is a top view of a CMP tool configured to selectively apply additional pressure to different regions of the wafer, according to one example of principles described herein.

FIG. 1B is a top view of a CMP tool configured to selectively apply additional pressure to different regions of the wafer. The top view shows the membrane 108 and the gas heads 112 positioned in a rectangular grid pattern. Other patterns are contemplated as well. For example, the gas heads may be positioned such that each row or column of gas heads 112 is offset from an adjacent row or column. Additionally, a varying number of gas heads may be used. The present example illustrates six rows and six columns of gas heads. In some examples, however, there may be a different number of rows and columns. For purposes of discussion, the number of rows of gas heads 112 will be denoted by the letter X and the number of columns of gas heads 112 will be denoted by the letter Y. In some examples, X may be equal to Y. In some examples, however, X may be less than or greater than Y. Specifically, in some examples, X may be three and Y may be four. In some examples, X may be four and Y may be three. Other examples are contemplated as well.

In general, a CMP tool with a greater number of gas heads 112 can selectively apply additional pressure to a greater number of smaller regions of the wafer. For example, if X is equal to two and Y is equal to two, then the CMP will have four gas heads 112. Thus, additional pressure can be supplied to only four different regions. In another example, if the total number of gas heads is 100, then the CMP tool is able to apply additional pressure to 100 different, individually selectable regions of the wafer.

Figure 2A:
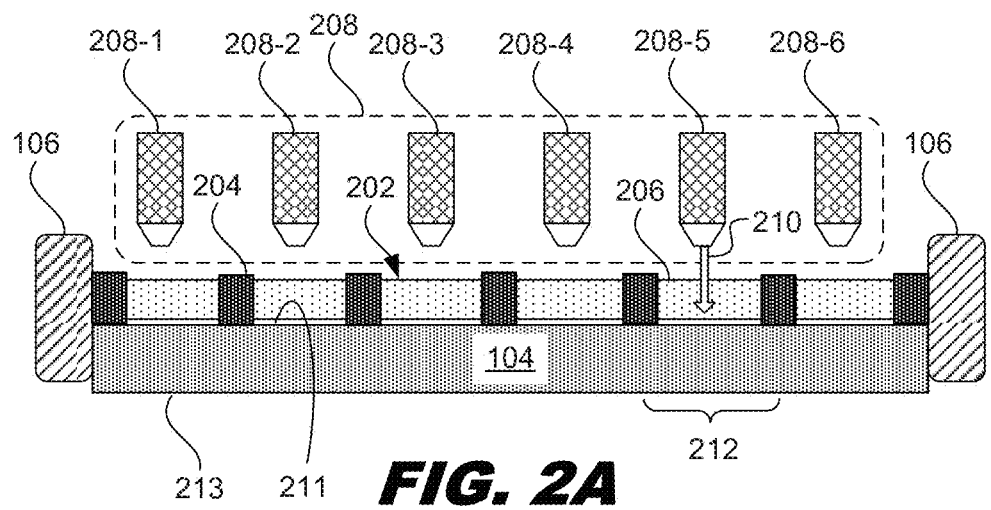
FIG. 2A is a diagram showing a cross-sectional view of a membrane used by the CMP tool that is configured to selectively apply additional pressure to different regions of the wafer, according to one example of principles described herein.

FIG. 2A is a diagram showing a cross-sectional view of a membrane 202 used by the CMP tool that is configured to selectively apply additional pressure to different regions of the wafer. According to the present example, the membrane 202 includes solid portions 204 around the perimeter of the membrane 202 as well as along gridlines. The spaces between the gridlines comprise porous regions 206 that allow a gas 210 to pass therethrough. The solid portions 204 help prevent gas from flowing into adjacent porous regions 206.

In the present example, there are six gas heads 208-1, 208-2, 208-3, 208-4, 208-5, 208-6 along the cross-sectional view shown in FIG. 2A. Each of the gas heads 208-1, 208-2, 208-3, 208-4, 208-5, 208-6 corresponds to a single porous region 206. In the present example, to apply additional pressure to region 212 of the wafer 104, gas heads 208-5 ejects gas 210 through the porous region 206 above region 212. The solid portions 204 surrounding the porous region 206 above region 212 of the wafer 104 may prevent the gas 210 from applying pressure to regions other than region 212.

By applying gas 210 to a top side 211 of the wafer 104, the region at which gas 210 is applied causes the corresponding region 212 on the bottom side 213 of the wafer 104 to press harder against the polishing pad (e.g., 102, FIG. 1). This causes the CMP process to be applied with additional force at region 212. Thus, if region 212 is determined to have a greater thickness, then additional pressure can be applied by gas head 208-5 to apply additional pressure to region 212. As a result, the CMP process can produce a more planar surface.

Figure 2B:
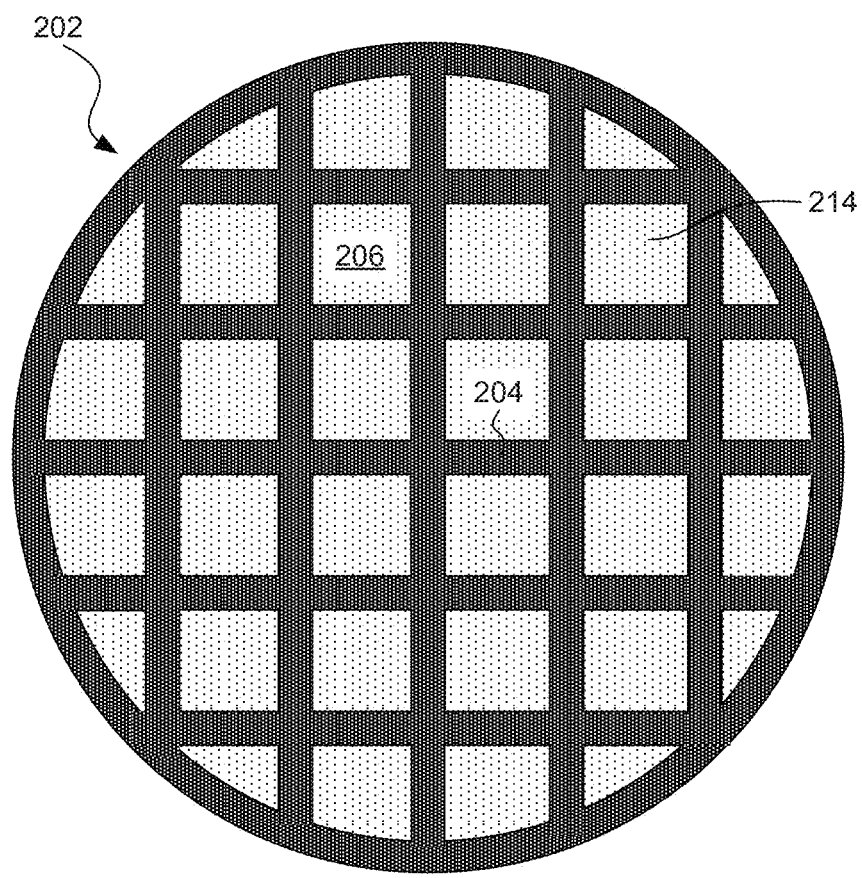
FIG. 2B is a top view of the membrane used by the CMP tool that is configured to selectively apply additional pressure to different regions of the wafer, according to one example of principles described herein.

FIG. 2B is a top view of the membrane 202 used by the CMP tool that is configured to selectively apply additional pressure to different regions of the wafer. In, the present example, the membrane 202 includes six rows and six columns. For purposes of discussion, the number of rows in a membrane will be denoted by the letter N and the number of columns be denoted by the letter M. Here, N is equal to six and M is equal to six. There are thus a total of 32 regions 214 at which additional pressure can be selectively applied. For purposes of discussion, such regions 214 will be referred to as grid regions 214. In other examples, however, N and M may have different values. In some cases, N and M may be equal. In some cases, N and M may be different.

In the present example, N and M correspond to X and Y. In other words, the number of gas heads is equal to the number of regions within the grid of the membrane 202. In some examples, however, there may be more than one gas head per grid region 214 within the membrane 202. For example, there may be two or more gas heads per grid region 214.

In some examples, one of a plurality of membranes may be inserted into the CMP tool for use during the CMP process. Different membranes may have different grid sizes. For example, a membrane with a simple 2×2 grid may be inserted. Thus, there may be several gas heads corresponding to a single one of the four grid regions. To apply additional pressure through such a membrane, any number of the gas heads corresponding to a particular grid region may be used to apply pressure to the proper grid region.

While the present example illustrates a membrane with a rectangular grid, other non-radial grids may be used. For example, a grid in which each of the grid regions is triangularly shaped may be used. In some examples, a grid in which each of the grid regions is hexagonally or octagonally shaped may be used.

Figure 3A:
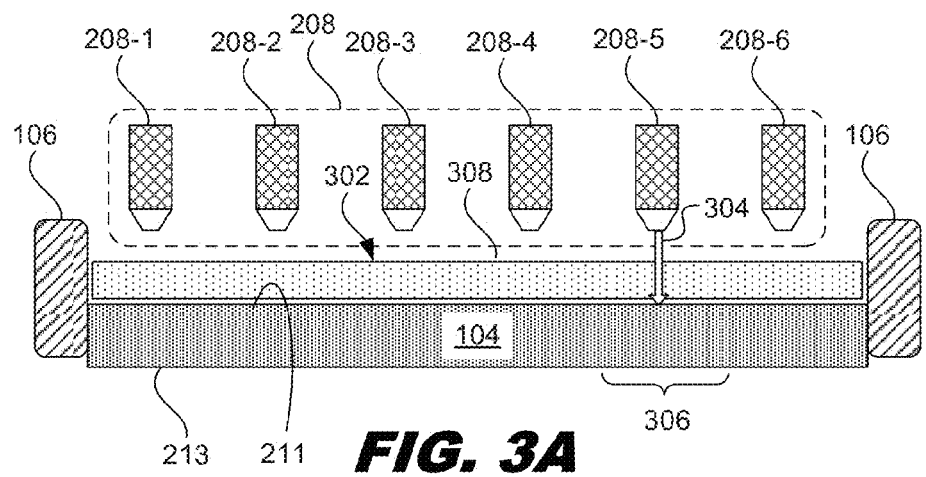
FIG. 3A is a diagram showing a cross-sectional view of a membrane used by the CMP tool that is configured to selectively apply additional pressure to different regions of the wafer, according to one example of principles described herein.

FIG. 3A is a diagram showing a cross-sectional view of a membrane used by the CMP tool that is configured to selectively apply additional pressure to different regions of the wafer. In the present example, the membrane 302 does not include solid portions along grid lines. Instead, the membrane 302 includes a single porous region 308 through which all gas heads 208 may eject gas. According to the present example, to apply additional pressure to region 306, gas head 208-5 applies gas 304 through the single porous region 308 and at the top surface 211 of the wafer 104 over region 306. Thus, the bottom surface 213 of the wafer 104 may be pressed with additional force against the polishing head (e.g., 102, FIG. 1). Thus, if region 306 is determined to have a greater thickness, then additional pressure can be applied by gas head 208-5 to apply additional pressure to region 306. As a result, the CMP process can produce a more planar surface.

Figure 3B:
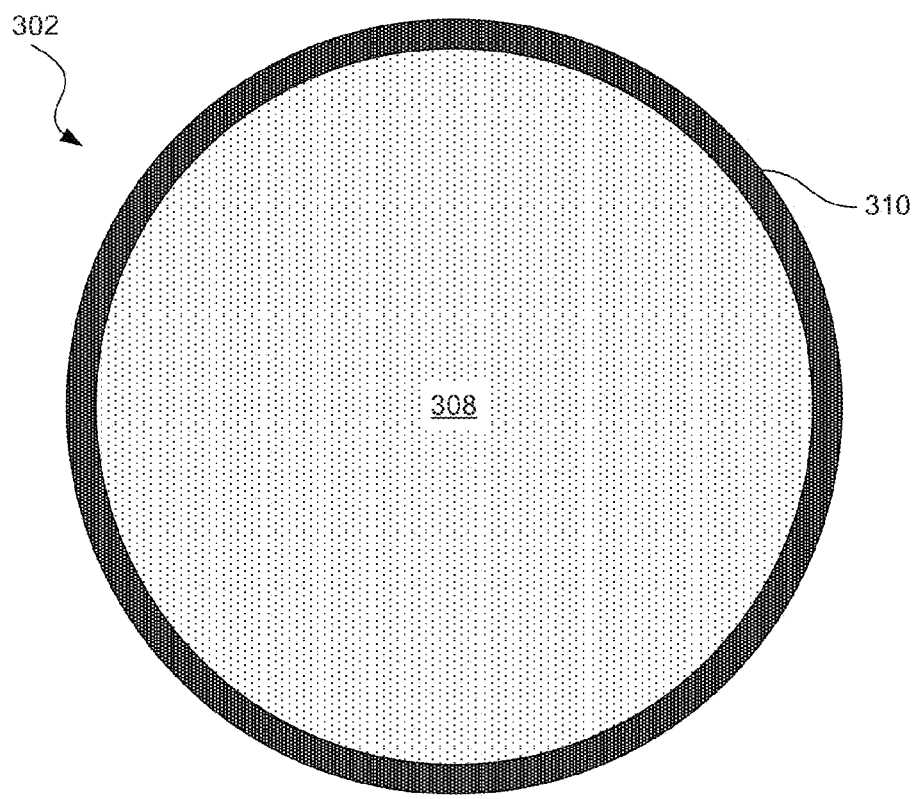
FIG. 3B is a top view of the membrane used by the CMP tool that is configured to selectively apply additional pressure to different regions of the wafer, according to one example of principles described herein.

FIG. 3B is a top view of the membrane 302 used by the CMP tool that is configured to selectively apply additional pressure to different regions of the wafer. According to the present example, the membrane 302 includes a solid portion 310 around the perimeter of the membrane 302. Within the solid perimeter 310 is a single porous region 308. The porous region 308 may be configured to allow gas to pass through in order to apply pressure to the wafer.

Figure 4A:
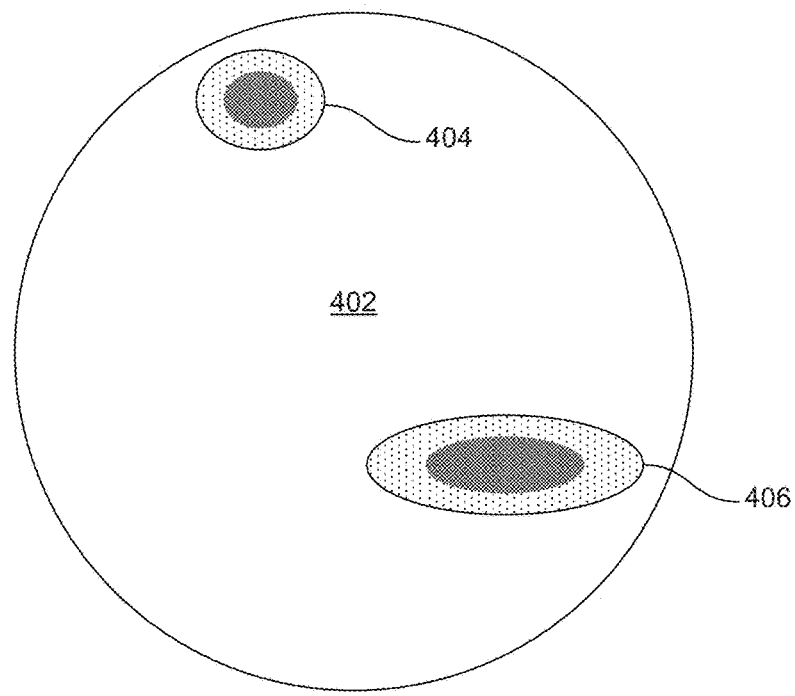
FIG. 4A is a top view of a wafer showing varying topography of the wafer before a CMP process is applied, according to one example of principles described herein.

FIG. 4A is a top view of a wafer 402 showing varying topography of the wafer 402 before a CMP process is applied. According to the present example, before the CMP process is applied, the topography of the wafer 402 is measured. More specifically, the topography of the surface that is to be planarized by the CMP process is measured. Various metrology tools may be used to measure the topography. Such tools may include, but are not limited to, optical interference microscopes.

In the present example, there are two portions 404, 406 at which it is determined that the thickness is above a specified thickness. The specified thickness may be the average thickness of the wafer 402. For example, it may be that every region of the wafer is within a certain tolerance range of the specified thickness except for portions 404 and 406. Portions 404 and 406 may have a greater thickness for a variety of reasons. In one example, there may be additional features within portions 404 and 406 that result in a greater thickness. After the CMP process, it is desirable that top surface of the wafer 402 be substantially planar. In other words, it is desirable that there be no portions like 404 and 406 that have a greater thickness. Without use of principles described herein, the CMP process may not fully planarize the portions 404 and 406. In other words, the relative topography after the CMP process may be similar to the relative topography before the CMP process.

Figure 4B:
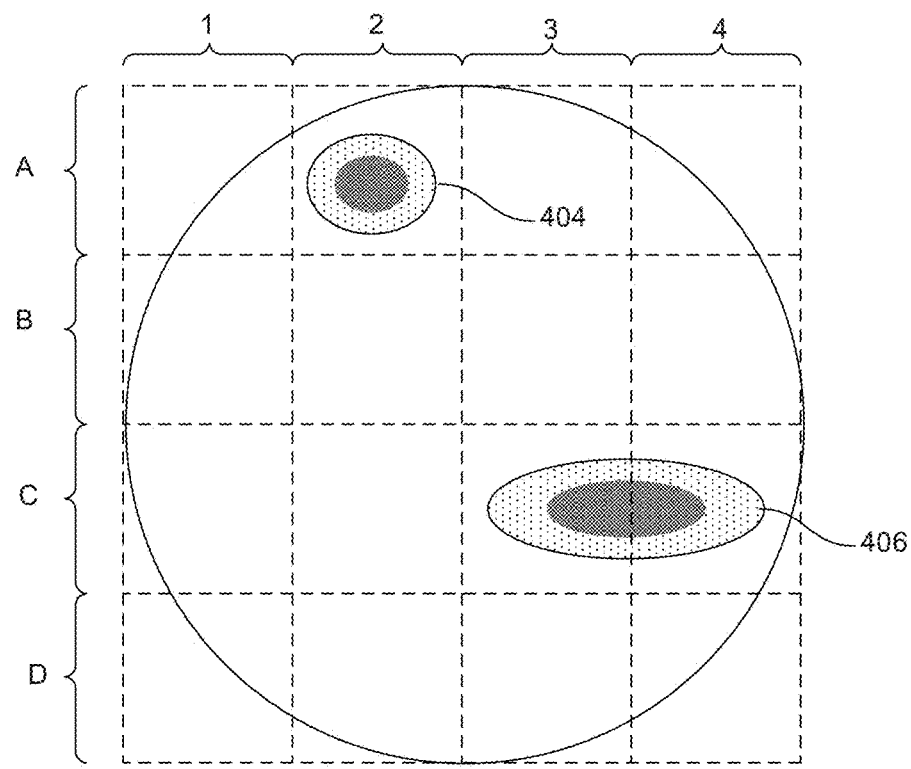
FIG. 4B is a top view of the wafer showing grid lines indicating different regions that may be selected for additional application of pressure, according to one example of principles described herein.

FIG. 4B is a top view of the wafer showing grid lines indicating different regions that may be selected for additional application of pressure. In the present example, the CMP tool is configured to selectively apply pressure over a 4×4 grid over the wafer 402. More specifically, there are 16 different regions at which the CMP tool may apply additional pressure. In the present example, additional pressure may be applied to regions A2, C3 and C4. By applying additional pressure to these regions, the resulting topography after the CMP process may be substantially planar.

Figure 5A:
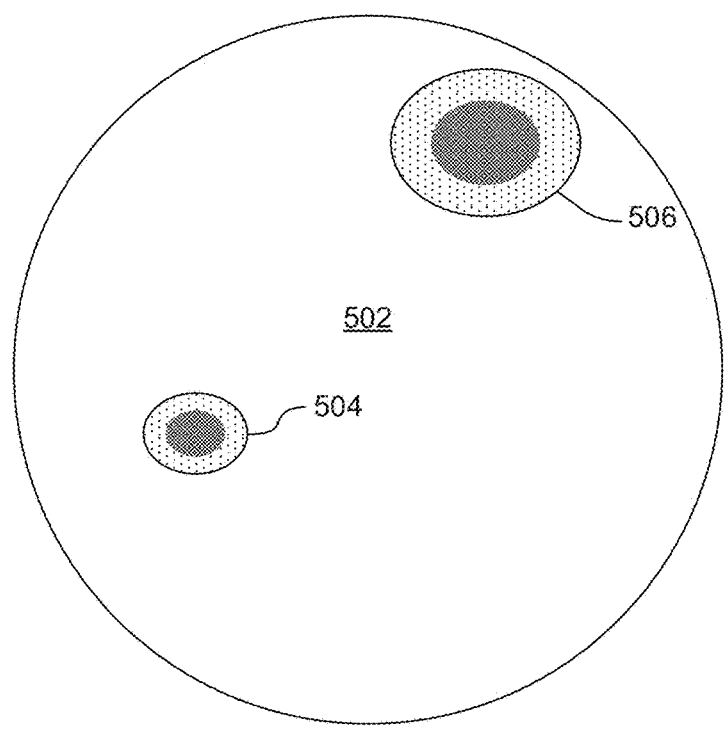
FIG. 5A is a top view of a wafer showing varying topography of the wafer before a CMP process is applied, according to one example of principles described herein.

FIG. 5A is a top view of a wafer 502 showing varying topography of the wafer 502 before a CMP process is applied. In the present example, there are two portions 504, 506 at which it is determined that the thickness is above a specified thickness. Again, after the CMP process, it is desirable that the top surface of the wafer be substantially planar. In other words, it is desirable that there be no portions like 504 and 506 that have a greater thickness. Without use of principles described herein, the CMP process may not fully planarize the portions 504 and 506. In other words, without use of principles described herein, the relative topography after the CMP process may be similar to the relative topography before the CMP process.

Figure 5B:
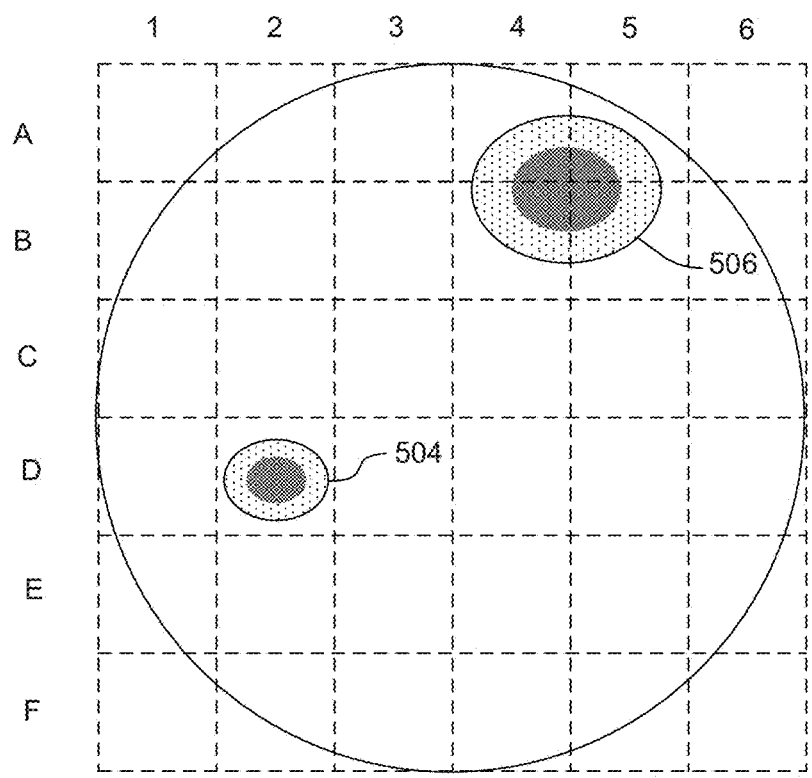
FIG. 5B is a top view of the wafer showing grid lines indicating different regions that may be selected for additional application of pressure, according to one example of principles described herein.

FIG. 5B is a top view of the wafer showing grid lines indicating different regions that may be selected for additional application of pressure. In the present example, the CMP tool is configured to selectively apply pressure over a 6×6 grid over the wafer 502. More specifically, there are 32 different regions at which the CMP tool may apply additional pressure (the four corner regions A1, A6 F1, F6 are not counted). In the present example, additional pressure may be applied to regions A4, A5, B4, B5, and D2. By applying additional pressure to these regions, the resulting topography after the CMP process may be substantially planar.

Figure 6:
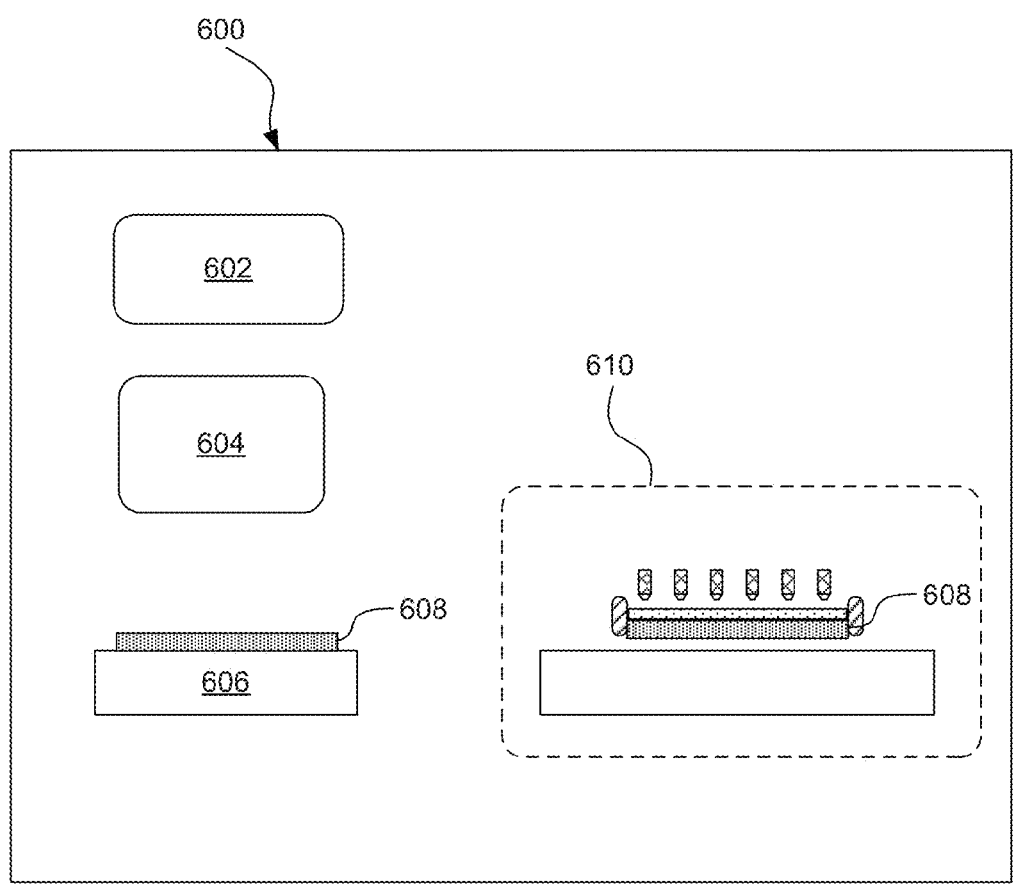
FIG. 6 is a diagram showing an illustrative system for selectively and asymmetrically applying different amounts of pressure to a wafer during a CMP process, according to one example of principles described herein.

FIG. 6 is a diagram showing an illustrative CMP system 600 for selectively and asymmetrically applying different amounts of pressure to a wafer during a CMP process. According to the present example, the system 600 includes a control module 602, a measurement module 604, a measurement wafer stage 606, and a CMP module 610.

The control module 602 includes hardware and software to manage the CMP system 600. The control module 602 may include one or more processors and memory. The memory may store machine readable instructions that when executed by the one or more processors, cause the system to perform various tasks. For example, the control module 602 may direct various pieces of hardware to move a wafer 608 through the CMP system 600 as desired. In one example, the control module 602 controls robotic arms or other mechanisms to receive a wafer 608 and places only measurement wafer stage 606.

The measurement wafer stage 606 is designed to hold the wafer 608 in place while the measurement module 604 measures the topography of the wafer 608. The wafer 608 may be placed into position on the measurement wafer stage 606 by robotic mechanisms under the control of the control module 602.

After the wafer 608 is placed appropriately onto the measurement wafer stage 606, the measurement module 604 measures the topography of the wafer 608. The measurement module 604 may include a measurement tool. In one example, the measurement module 604 utilizes optical measurement technology. For example, the measurement module 604 may be an interference microscope. The data that represents the topography of the wafer may be provided to the control module 602. In some examples, the control module 602 may perform an analysis on the measurement data obtained by the measurement module 604. Such analysis may be used to determine what portions of the wafer 608 have a greater thickness than other portions of the wafer 608.

The control module 602 may receive data from the CMP module 610 indicating the number of regions at which additional pressure can be applied to the wafer 608. Such data may also include the positioning of each of the separate regions at which additional pressure can be selectively applied. Using such data as well as the measurement data, the control module 602 can select certain regions at which additional pressure is to be applied. In one example, the measurement data from the measurement module 604 may indicate that the portions 404 and 406 as shown in FIG. 4A have greater than average thicknesses. Additionally, the control module 602 may receive information from the CMP module 610 related to the grid layout as shown in FIG. 4B. Thus, the control module 602 may determine that regions A2, C3, and C4 (i.e., the regions corresponding to portions 404 and 406) should have additional pressure applied thereto. In a further example, the measurement data from the measurement module 604 may indicate that the portions 504 and 506 as shown in FIG. 5A have greater than average thicknesses. Additionally, the control module 602 may receive information from the CMP module 610 related to the grid layout as shown in FIG. 5B. Thus, the control module 602 may determine that regions A4, A5, B4, B5, and D2 (i.e., the regions corresponding to portions 504 and 506) should have additional pressure applied thereto.

After the topography of the wafer 608 has been measured by the measurement module 604, the control module 602 may cause the wafer 608 to be moved into the CMP module 610. For example, the control module 602 may control various robotic mechanisms to move the wafer into position to be held by a retaining ring (e.g., 106, FIG. 1) of the CMP module 610.

The CMP module 610 may include various components used to perform the CMP process on a wafer 608 secured within the retaining ring. The CMP module 610 may include various features described above the text accompanying FIGS. 1A and 1B. For example, the CMP module 610 may include a polishing, pad (e.g., 102, FIG. 1A) and a polish head (e.g., 103, FIG. 1A). The polish head (e.g., 103, FIG. 1A) includes a retaining ring (e.g., 106, FIG. 1A) and a set of gas heads (e.g., 112, FIG. 1A).

As described above, the CMP process involves placing a CMP slurry solution on the polishing pad and using the polishing had to press the wafer 608 against the polishing pad. The chemicals within the CMP slurry solution as well as the mechanical force of the wafer 608 against the polishing pad are designed to produce a substantially planar surface of the wafer and remove undesired materials. Additionally, as described above, the CMP module 610 is designed to selectively apply additional pressure to different regions of the wafer 608. More specifically, the CMP module 610 is designed to selectively apply additional pressure to different asymmetrically positioned regions of the wafer 608.

The CMP module 610 may receive instructions from the control module 602 regarding to which regions additional pressure should be applied. The CMP module 610 may then apply additional pressure to such regions by injecting gas out of the corresponding, gas heads for those regions. By applying additional pressure at certain regions that have a greater thickness, the topography of the wafer 608 after the CMP process may be substantially more planar.

Figure 7:
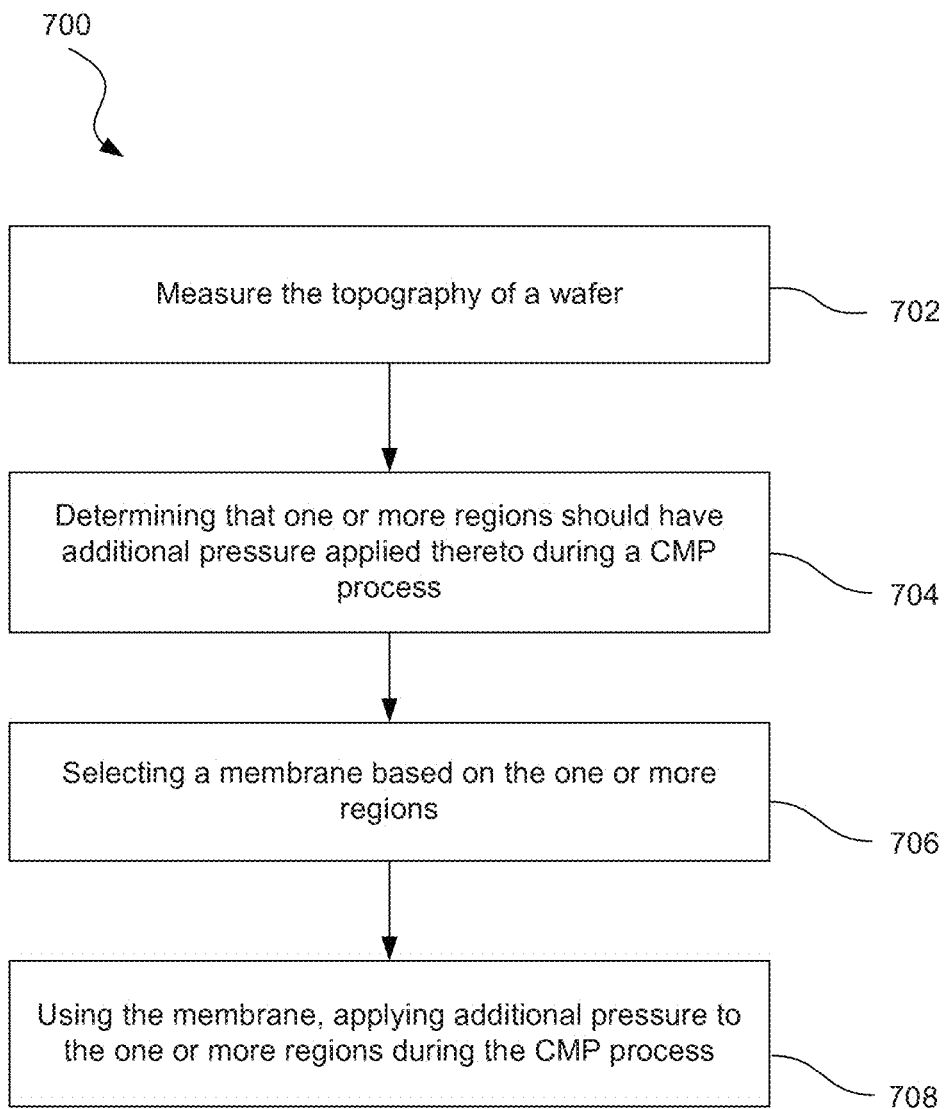
FIG. 7 is a flowchart showing an illustrative system for selectively and asymmetrically applying different amounts of pressure to a wafer during a CMP process, according to one example of principles described herein.

FIG. 7 is a flowchart showing an, illustrative system for selectively and asymmetrically applying different amounts of pressure to a wafer during a CMP process. According to the present example, the method 700 includes a step 702 for measuring the topography of the wafer. As described above, this may be done through use of the measurement module (e.g., 604, FIG. 6). By measuring the topography of the wafer, it may be determined that some regions of the wafer have a thickness that is greater than a specified thickness. The specified thickness may be an average thickness of the wafer. In some examples, the specified thickness may be a predetermined process specific thickness. For example, the specified thickness may be a specific number based on the design of the devices formed within the wafer.

The method 700 further includes a step 704 for determining one or more regions have additional pressure applied thereto during a CMP process. For example, if the thickness of a certain region of the wafer is outside the bounds of a tolerance range for the specified thickness, then such a region may be identified as one to which additional pressure is to be applied during the CMP process.

The method 700 further includes a step 706 for selecting the membrane based on the one or more regions. As described above, various sized membranes, each having a different number of regions, may be a used in accordance with principles described herein. In general, it may be desirable to select a membrane having appropriately sized grid regions so as to cover the regions of the wafer that have a greater than average thickness while minimizing unnecessary coverage of the wafer. In other words it is desirable to avoid applying additional pressure to regions of the wafer that do not have a greater thickness than the specified thickness.

The method 700 further includes a step 708 for using the membrane to apply additional pressure to the one or more regions during the CMP process. In other words, while the CMP process is being performed, the gas heads may apply additional pressure to the appropriate grid regions of the membrane so that additional pressure can be applied to the appropriate regions of the wafer. Thus, the portions that have a greater thickness than the specified thickness can be smoothed out during the CMP process. This results in a more planar surface of the wafer after the CMP process.

According to one example, a method includes measuring a topography of a wafer, determining that a first portion of the wafer has a greater thickness than a specified thickness. The method further includes, after measuring the wafer, performing a Chemical Mechanical Polishing (CMP) process to a first side of the wafer, and during application of the CMP process, applying additional pressure to a region of the wafer, the region comprising an asymmetric part of the wafer, the region including at least a part of the first portion of the wafer.

According to one example, a method includes measuring a topography of a wafer, determining that a first portion of the wafer has a greater thickness than a specified thickness, placing the wafer adjacent a membrane, and while performing a Chemical Mechanical Polishing (CMP) process to a first side of the wafer, using the membrane to apply additional pressure to a selectable region of the wafer, the selectable region corresponding to the first portion, the region corresponding to an asymmetric part of the wafer.

According to one example, a system for performing a Chemical Mechanical Polishing (CMP) process, the system including a measurement module to determine a topography of a wafer and a CMP module having a polishing pad, a retaining ring, and a polish head configured to apply varying pressure to different portions of the wafer secured by the retaining ring, the different portions being individually selectable on a non-radial grid. The system further includes a control module to determine regions of the wafer having a greater thickness than a specified thickness and cause the polish head to apply additional pressure to the regions of the wafer having the greater thickness than the specified thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   measuring a topography of a wafer;

determining that a first portion of the wafer has a greater thickness than a specified thickness;
after measuring the wafer, performing a Chemical Mechanical Polishing (CMP) process to a first side of the wafer; and
during application of the CMP process, applying additional pressure to a region of the wafer, the region comprising an asymmetric part of the wafer, the region including at least a part of the first portion of the wafer,
wherein the applying additional pressure comprises applying gas to a porous region of a membrane placed adjacent to the wafer, the membrane comprising solid portions corresponding to grid lines defining the porous region.

2. The method of claim 1, wherein applying additional pressure to the membrane comprises applying a gas to the membrane at a specific region of the membrane such that the gas permeates the porous region of the membrane and applies pressure to the wafer.

3. The method of claim 1, wherein the membrane comprises a single porous region spanning multiple grid regions.

4. The method of claim 1, wherein the specified thickness is an average thickness of the wafer.

5. The method of claim 1, wherein the specified thickness is a predetermined process specific thickness.

6. The method of claim 1, wherein measuring the topography of the wafer is performed by a measuring tool integrated with a CMP tool used to perform the CMP process.

7. The method of claim 1, wherein the membrane is divided into a plurality of regions of a non-radial grid.

8. The method of claim 7, wherein the non-radial grid comprises a rectangular grid.

9. A method comprising:
measuring a topography of a wafer;
determining that a first portion of the wafer has a greater thickness than a specified thickness;
placing the wafer adjacent a membrane; and
while performing a Chemical Mechanical Polishing (CMP) process to a first side of the wafer, using the membrane to apply additional pressure to a selectable region of the wafer, the selectable region corresponding to the first portion, the region corresponding to an asymmetric part of the wafer,
the membrane comprises solid portions corresponding to grid lines and porous regions between the grid lines.

10. The method of claim 9, wherein the membrane is one of a plurality of membranes having differently sized grids.

11. The method of claim 9, wherein using the membrane to apply additional pressure comprises applying gas to a second side of the wafer through one of the porous regions corresponding to the first portion of the wafer.

12. The method of claim 9, wherein the membrane comprises a single porous region spanning each of a plurality of gas heads selectable by a CMP tool that performs the CMP process.

13. The method of claim 9, wherein the region is selectable by a CMP tool on a non-radial grid.

14. The method of claim 13, wherein the non-radial grid comprises a rectangular grid.

15. A system for performing a Chemical Mechanical Polishing (CMP) process, the system comprising:
a measurement module to determine a topography of a wafer;
a CMP module comprising:
a polishing pad;
a retaining ring; and
a polish head configured to apply varying pressure to different portions of the wafer secured by the retaining ring, the different portions being individually selectable on a non-radial grid; and
a control module to:
determine portions of the wafer having a greater thickness than a specified thickness; and
cause the polish head to apply additional pressure to regions of the wafer corresponding to the portions of the wafer having the greater thickness than the specified thickness, wherein the additional pressure is applied by applying gas to a porous region of a membrane placed adjacent to the wafer, the membrane comprising solid portions corresponding to grid lines defining the porous region.

16. The system of claim 15, wherein the measurement module is integrated with the CMP module into a single tool.

17. The system of claim 15, wherein the non-radial grid comprises a rectangular grid.

* * * * *